United States Patent
Alameh et al.

(10) Patent No.: US 8,730,209 B2
(45) Date of Patent: May 20, 2014

(54) METHOD FOR RESOLVING BLIND SPOTS ASSOCIATED WITH PROXIMITY SENSORS

(75) Inventors: Rachid M. Alameh, Crystal Lake, IL (US); Jun Jiang, Lake Zurich, IL (US)

(73) Assignee: Motorola Mobility LLC, Chicago, IL (US)

(*) Notice: Subject to any disclaimer, the term of this patent is extended or adjusted under 35 U.S.C. 154(b) by 181 days.

(21) Appl. No.: 13/011,177

(22) Filed: Jan. 21, 2011

(65) Prior Publication Data

US 2012/0188171 A1 Jul. 26, 2012

(51) Int. Cl.
*G09G 5/00* (2006.01)
*G06F 3/033* (2013.01)
*G06K 9/00* (2006.01)

(52) U.S. Cl.
USPC .................. 345/175; 345/157; 382/124

(58) Field of Classification Search
USPC .............. 178/18.01–18.03, 18.09, 18.11; 345/102, 156, 165–166, 173, 175–176, 345/178, 207, 697, 157; 349/61, 64; 356/615; 359/613; 362/19, 97.2–97.3, 362/555; 385/17, 129, 146, 15, 31, 42; 382/124
See application file for complete search history.

(56) References Cited

U.S. PATENT DOCUMENTS

| | | | |
|---|---|---|---|
| 2004/0201579 A1* | 10/2004 | Graham | 345/175 |
| 2004/0252867 A1* | 12/2004 | Lan et al. | 382/124 |
| 2008/0122803 A1* | 5/2008 | Izadi et al. | 345/175 |
| 2008/0246708 A1* | 10/2008 | Ishiguro | 345/87 |
| 2010/0060583 A1* | 3/2010 | Yan | 345/166 |

FOREIGN PATENT DOCUMENTS

| | | |
|---|---|---|
| EP | 1408343 A1 | 4/2004 |
| EP | 1947550 A1 | 7/2008 |
| GB | 2161266 A | 1/1986 |

OTHER PUBLICATIONS

Patent Cooperation Treaty, International Search Report and Written Opinion of the International Searching Authority for International Application No. PCT/US2012/021027, Jun. 4, 2012, 12 pages.

* cited by examiner

*Primary Examiner* — Quan-Zhen Wang
*Assistant Examiner* — Michael J Eurice

(57) ABSTRACT

A method for resolving blind spots associated with a proximity sensor provides an optical guide in cooperation with an isolator wall that separates a transmitting section and a receiving section of the proximity sensor. Additionally, a specific guide angle of the optical guide directs, towards a receiver, more light rays reflected off an external object than light rays transmitted from a light source in the transmitting section.

17 Claims, 18 Drawing Sheets

METHOD FOR RESOLVING BLIND SPOTS ASSOCIATED WITH PROXIMITY SENSORS

FIELD OF THE DISCLOSURE

The present disclosure relates generally to proximity sensors in a mobile communication device and more particularly to using a proximity sensor to detect opaque objects in a mobile communication device having a touchscreen for user interaction.

BACKGROUND

Detecting objects with a proximity sensor sometimes is less than reliable because of inability of light to be received by a proximity sensor receiver under certain conditions. For example, an object placed in very close proximity or in actual contact with a glass interface might not allow light to pass to the receiver side of the proximity sensor. There are two main paths for light to reach the receiver without an object present, either by reflecting below the glass surface or alternatively through the glass itself. This unintended coupling between the transmitter and receiver side is referred to as local coupling; and is detrimental to the operation of the proximity sensor. The local coupling causes some of the transmitted light rays or optical signal to reach the receiver in the absence of an object in front of the proximity sensor. The light rays reflecting below the glass are typically eliminated by placing an isolator barrier between the transmitting and receiving sides of the proximity sensor. The light rays propagating through the glass can be controlled by the thickness of the glass or the extension of the isolating barrier through the glass. That substantially eliminates local coupling, but could create what is known in the industry as a blind spot. A blind spot is a situation where reflected light from an object does not find a path to reach the proximity sensor receiver especially when the object is in very close proximity to the glass or is actually touching the glass. This is made even worse when the object is opaque, for example an object can dark clothing or hair associated with a user. Specifically, dark clothing or hair has low light reflectivity thereby further reduces the possibility of a substantial number of light rays from reaching the receiver side of the optical apparatus. Opaque materials causes light to reflect at the surface or be absorbed by the material. Dark opaque material causes light reflection to be minimal. A human body part such as a face or lips, on the other hand, allows light to pass through and reflects inside the skin surface off of human bones, blood vessels, tissue, etc; thereby causing light to travel a greater distance above the glass to reach the receiver.

As such, the light in the opaque case is forced to reflect much closer to the glass surface when an opaque object is present than would otherwise be the case when light reflects from a greater distance such as the case when a body is in contact with the glass from inside human skin. This opaqueness scenario makes the blind spot problem much worse, especially if the opaque object is dark or has low reflectivity for the transmitted light from the proximity sensor.

Accordingly, there is a need for a method for resolving blind spots associated with proximity sensors.

BRIEF DESCRIPTION OF THE FIGURES

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
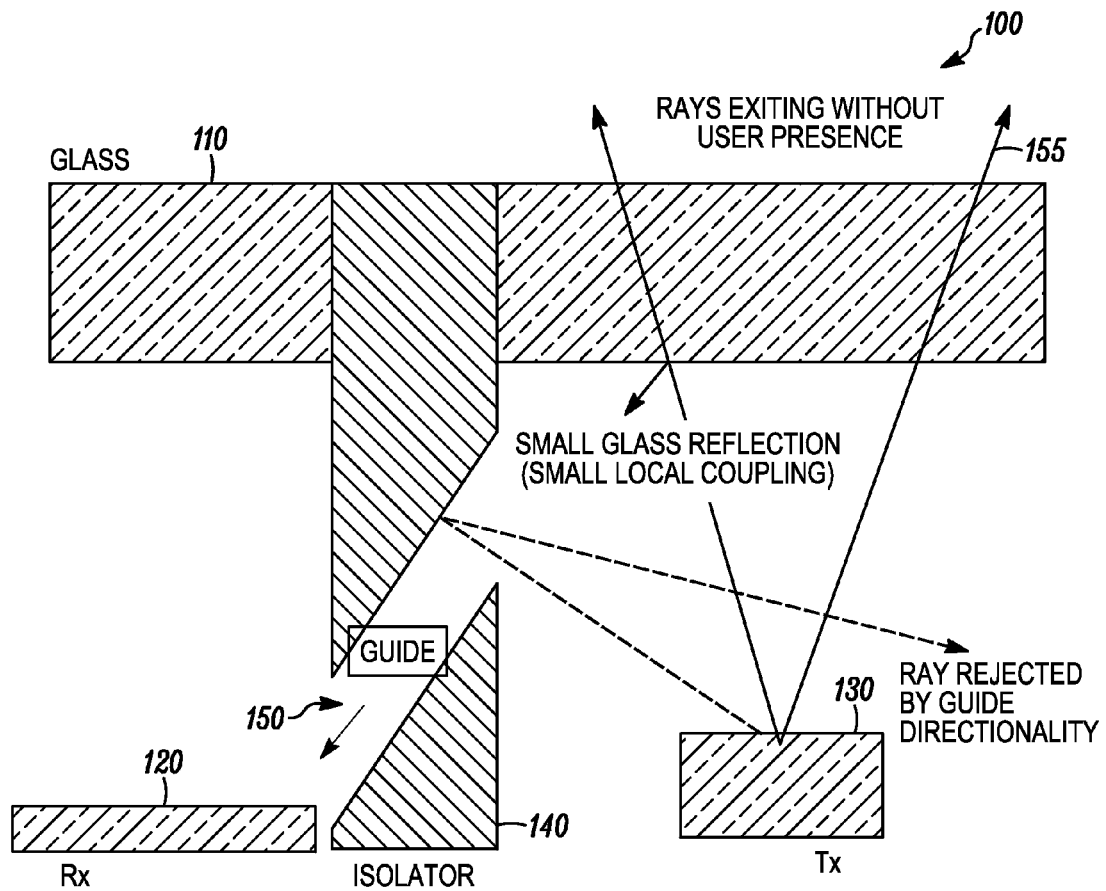
FIG. 1 is a pictorial illustration of a glass interface without an object present and in cooperation with a proximity sensor for a mobile communication device.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Before describing in detail embodiments that are in accordance with the present invention, it should be observed that the embodiments reside primarily in combinations of method steps and device components related to associating objects in an electronic device. Accordingly, the device components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the method, or device that comprises the element. Also, throughout this specification the term "key" has the broad meaning of any key, button or actuator having a dedicated, variable or programmable function that is actuatable by a user.

Techniques and technologies may be described herein in terms of functional and/or logical block components, and with reference to symbolic representations of operations, processing tasks, and functions that may be performed by various computing components or devices. Such operations, tasks, and functions are sometimes referred to as being computer-executed, computerized, software-implemented, or computer-implemented. In practice, one or more processor devices can carry out the described operations, tasks, and functions, and the various block components shown in the figures may be realized by any number of hardware, software, and/or firmware components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices.

For the sake of brevity, conventional techniques related to signal processing, data transmission, signaling, network control, and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter.

In this regard, FIG. 1 is a pictorial diagram that illustrates an exemplary embodiment of an optical apparatus 100 for use in a mobile communication device. Optical apparatus 100 may be employed in a tablet, a mobile phone, a personal digital assistant, a gaming device, audio device (such as an MP3 device) or a device that combines any of the aforementioned or a device that is useful for displaying information, data, and images. The optical apparatus 100 may include a glass interface 110 that may be whole or partioned or comprise of one or more apertures. The glass interface has an external side 112 and an internal side 114. Residing below the glass interface 110 are a receiver 120 and transmitter 130 for a proximity sensor (not shown). The proximity sensor is capable of sensing the nearness, closeness, or proximity of an object to the glass interface 110. The proximity sensor operates in a conventional fashion once an object's presence has been detected. Receiver 120 and transmitter 130 of the proximity sensor are isolated or separated by an isolator 140. Isolator 140 can be a barrier, a wall, or material that isolates or eliminates coupling between the transmitter and receiver side of the proximity sensor caused by internal reflections. An optical guide 150 operates cooperatively with the isolator 140. The optical guide 150 may be embedded within isolator 150 or may be abutted against the isolator 140. The cross-sectional area of optical guide 150 can include a configuration that may be circular, rectangular, or in a narrow slit form, or any odd shape in between. Emitted light rays 155 are transmitted from the transmitter 130 of the proximity sensor and exit the glass interface 110. The light rays 155 travel substantially uninterrupted through glass interface 110 when there is no object present on the other side of the glass interface 110 to bounce or reflect the light rays 155. A minimal amount of light rays 155 does reflect from the glass interface 110 itself. Small reflected rays from the glass interface itself reach the optical guide 150 and can still reach the receiver 120 through the optical guide 150, because of the orientation of optical guide 150; however, larger emitted rays that strike the optical guide 150 will mostly be rejected by optical guide 150 because of the orientation of optical guide 150 with respect to the LED location.

Figure 2:
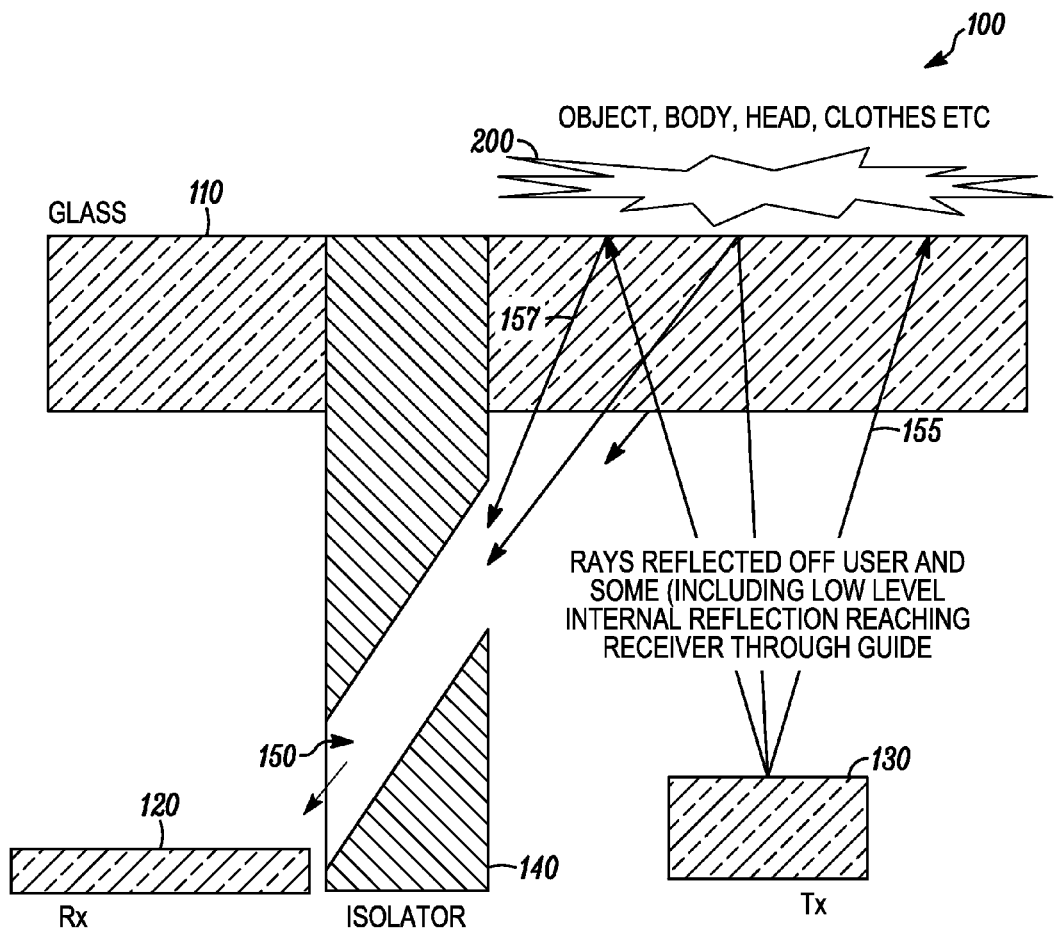
FIG. 2 is a pictorial illustration of a glass interface with an object present and in cooperation with a proximity sensor for a mobile communication device.

Referring to FIG. 2, the same components are included for optical apparatus 100. One major difference is that an object 200 now either is in contact with glass interface 110 or is in near proximity to glass interface 110. Object 200 can be part of a mobile communication device user's body, such as a head, ear, eye, or mouth. In addition, object 200 can be hair or clothing. Notably, when object 200 is hair or clothing, for example, object 200 becomes opaque to light rays. That is light rays may not pass through object 200 and are reflected off object 200 back through the glass interface 110, alternatively the light rays may be absorbed by the opaque object 200. Once the reflected light rays 157 reach the underside of glass interface some with favorable directionality are passed through the optical guide 150 which funnels the reflected light rays 157 towards receiver 120. Optical guide 150 is sometimes referred to as a light pipe, light guide, light medium.

The various tasks performed in connection with an illustrated and described process may be performed by software, hardware, firmware, or any combination thereof. For illustrative purposes, the following description of certain processes may refer to elements mentioned above in connection with FIG. 1 and FIG. 2. In practice, portions of a described process may be performed by different elements of the described system. It should be appreciated that a described process may include any number of additional or alternative tasks, the tasks shown in the figures need not be performed in the illustrated order, and a described process may be incorporated into a more comprehensive procedure or process having additional functionality not described in detail herein. Moreover, one or more of the tasks shown in a figure could be omitted from an embodiment of the respective process as long as the intended overall functionality remains intact.

Figure 3:
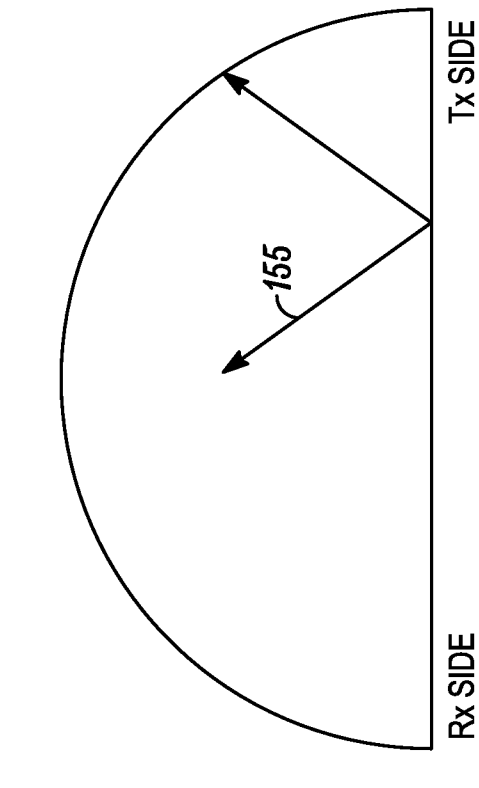
FIG. 3 is a schematic of how an optical guide's directional orientation affects the received light.
Figure 3:
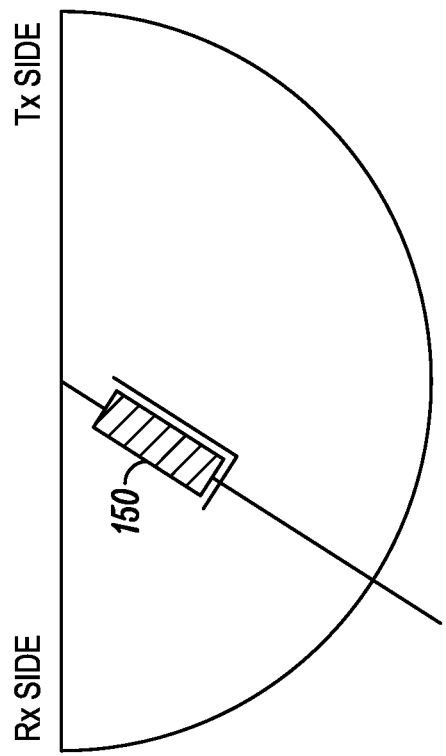

A closer look at the optical guide 150 is shown in FIG. 3. The orientation of the optical guide 150 is such that optical guide 150 passes some light rays that originate on or above the glass interface 110 (reflected light rays); and optical guide 150 rejects light rays originating below the glass interface 110 (excluding reflected rays from the internal side 114 of glass interface 110).

The optical guide orientation going from the transmitter side toward the receiver side of the proximity sensor is within a hemisphere opposite in direction to the hemisphere of emitted light by the source. Each hemisphere forms 180 degrees.

For example, emitted light ray 155 has an angle that falls within a hemisphere encompassing the transmitter's pointing direction angle and wherein the orientation of the optical guide 150 is directed from the transmitter side toward the receiver side to form an angle that lies with the opposite hemisphere as seen in FIG. 3. Hence, the two hemispheres shown point in opposite directions.

Figure 4:
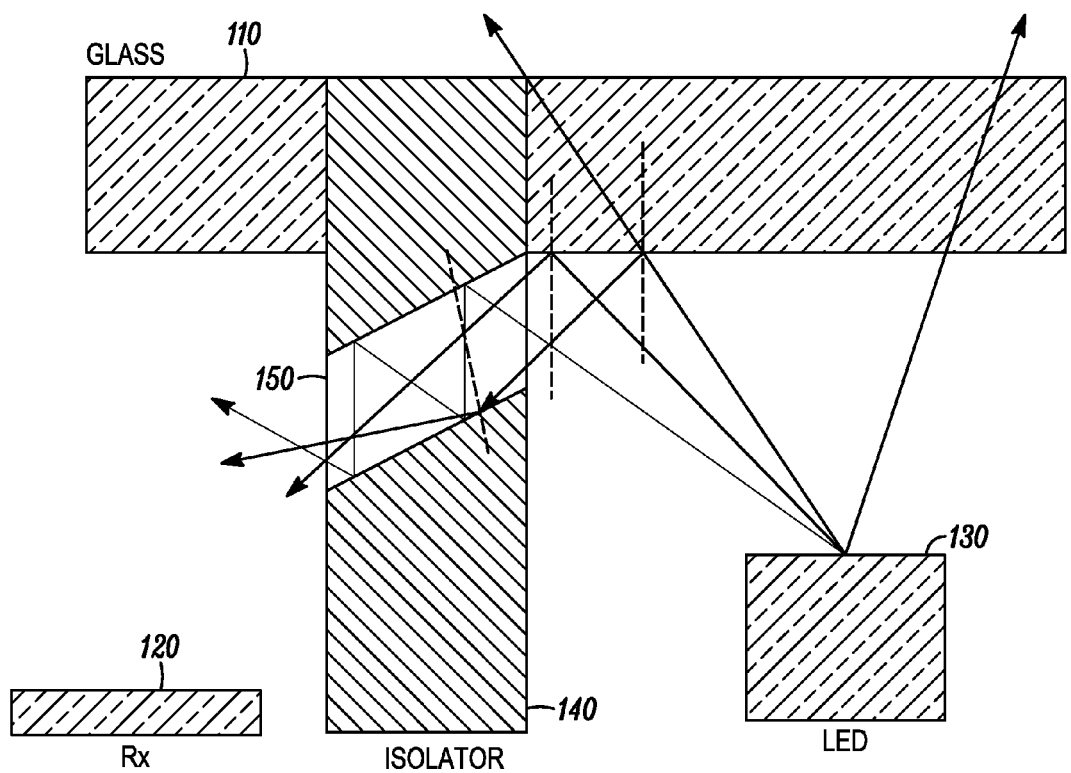
FIG. 4 is a pictorial illustration of one embodiment show coupling of local reflection bouncing under a glass interface.

Referring to FIG. 4, optical guide 150 within isolator 140 couples a small amount of local light reflection otherwise known as local coupling that reflects off the internal side 114 or underside of the glass interface 110. The amount of unintended local coupling can be controlled by the structure of the optical guide 150. The transmitter 130 can include a light emitting diode (LED) as a light source, but other light sources are contemplated as well.

Figure 5:
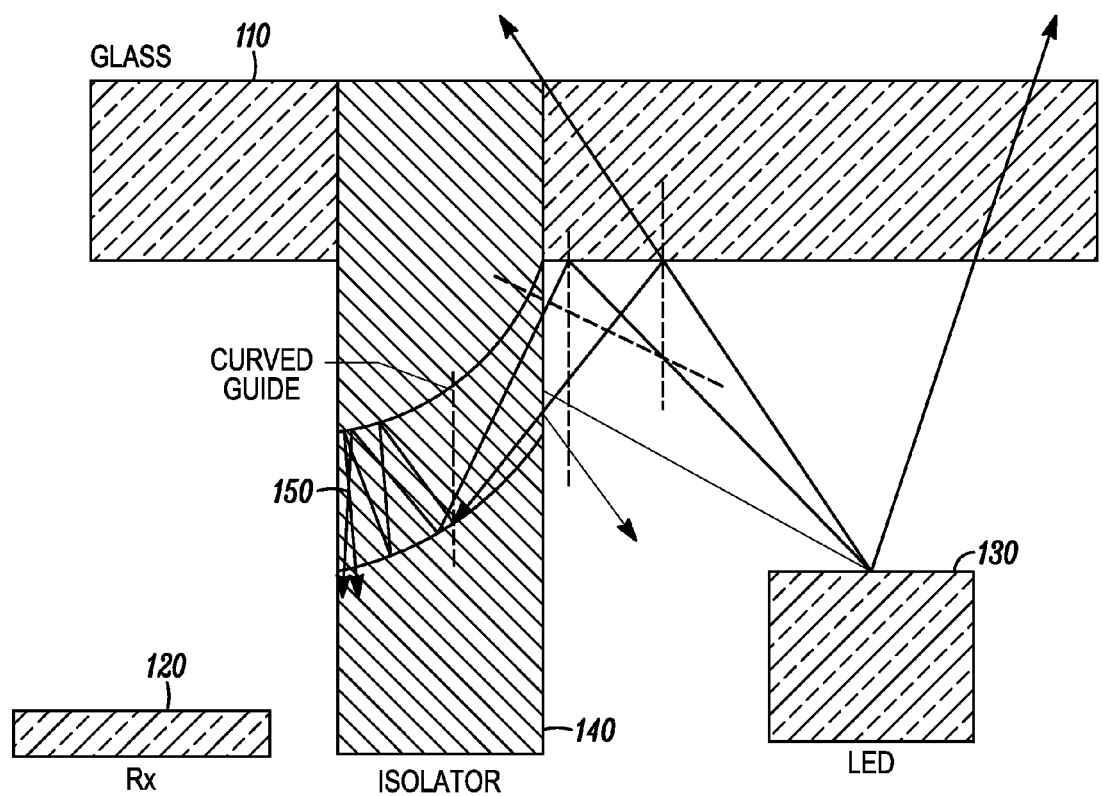
FIG. 5 is a pictorial example of a curved optical guide in the absence of an object.
Figure 6:
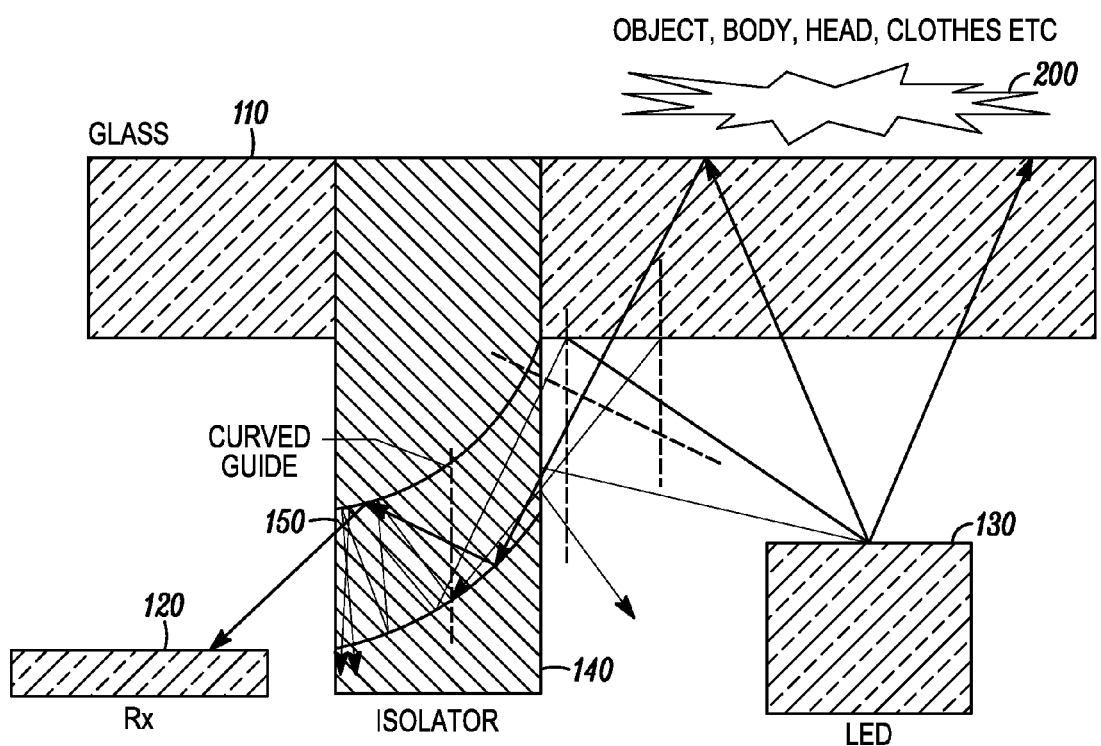
FIG. 6 is a pictorial example of a curved optical guide directing reflected light from an object.

In addition to the illustrated straight optical guide 150 shown in FIGS. 1 and 2, another exemplary embodiment includes a curved optical guide 150. The curved optical guide 150 is illustrated in FIGS. 5 & 6. Curved optical guide 150 could be designed to further minimize local coupling. Accordingly, the curved formfactor of optical guide 150, as shown in FIGS. 5 & 6, causes some locally coupled light rays that enter optical guide 150 and substantially dissipate or eventually exit optical guide 150 subsequent to a number of reflections off the optical guide's internal walls. FIG. 5 shows a substantial amount of light rays 155 emitted from the transmitter 130 having an LED that pass through the glass interface 110, because no object is present near the glass interface 110. FIG. 6 shows the reflections from an object 200 that is present near the glass interface 110 after having been emitted from the transmitter 130 having an LED. The curved optical guide 150 provides a means for the light rays to reach the receiver 120, isolated from the LED by isolator 140, when an object 200 is present near the glass interface 110. A curved optical guide 150 can be considered as having curved pipe coupling.

Figure 7:
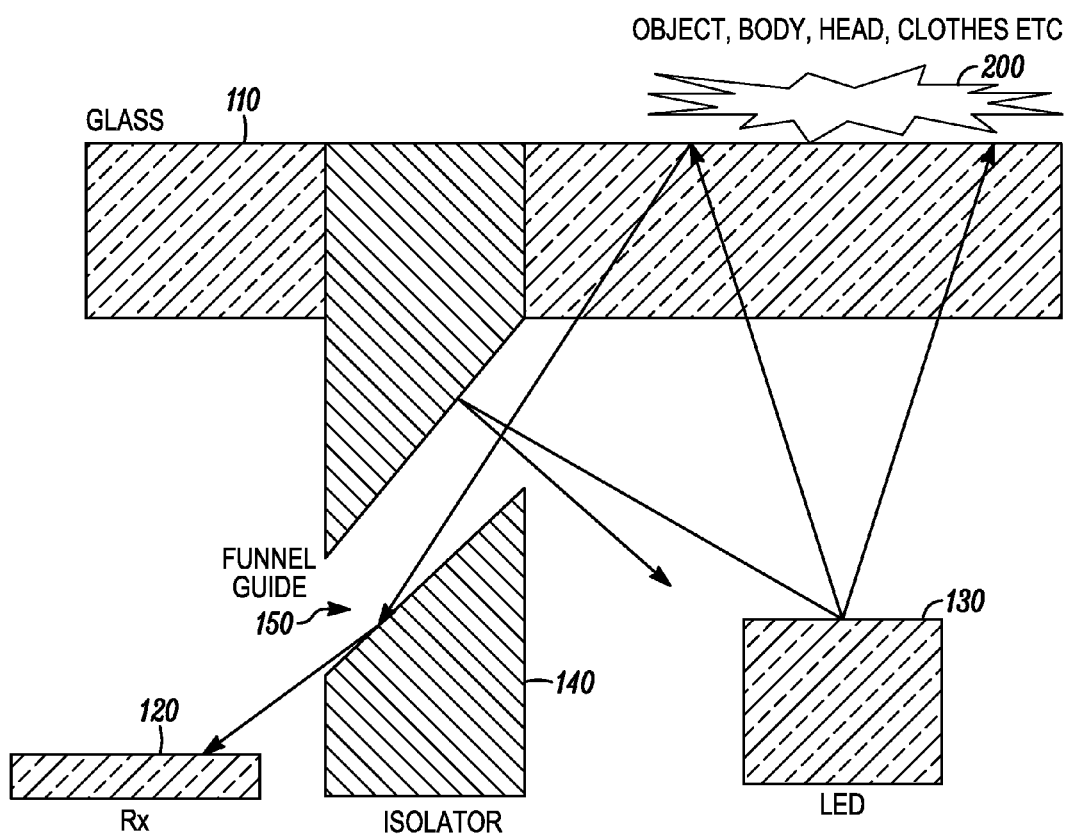
FIG. 7 is an example of a funnel optical guide directing reflected light from an object.

Another exemplary embodiment is shown in FIG. 7. Optical guide 150 is a funnel optical guide. The width and shape of the funnel optical guide 150, in FIG. 7, controls the amount of coupling between the transmitter 130 and the receiver 120 for locally coupled light relative to the amount of reflected light off of object 200. A funnel optical guide 150 can be considered as having funnel pipe coupling. Alternative embodiments may employ other guide shapes such as a tapered shape or the optical guide 150 may include lens apparatus that provide light focusing characteristics.

Figure 8:
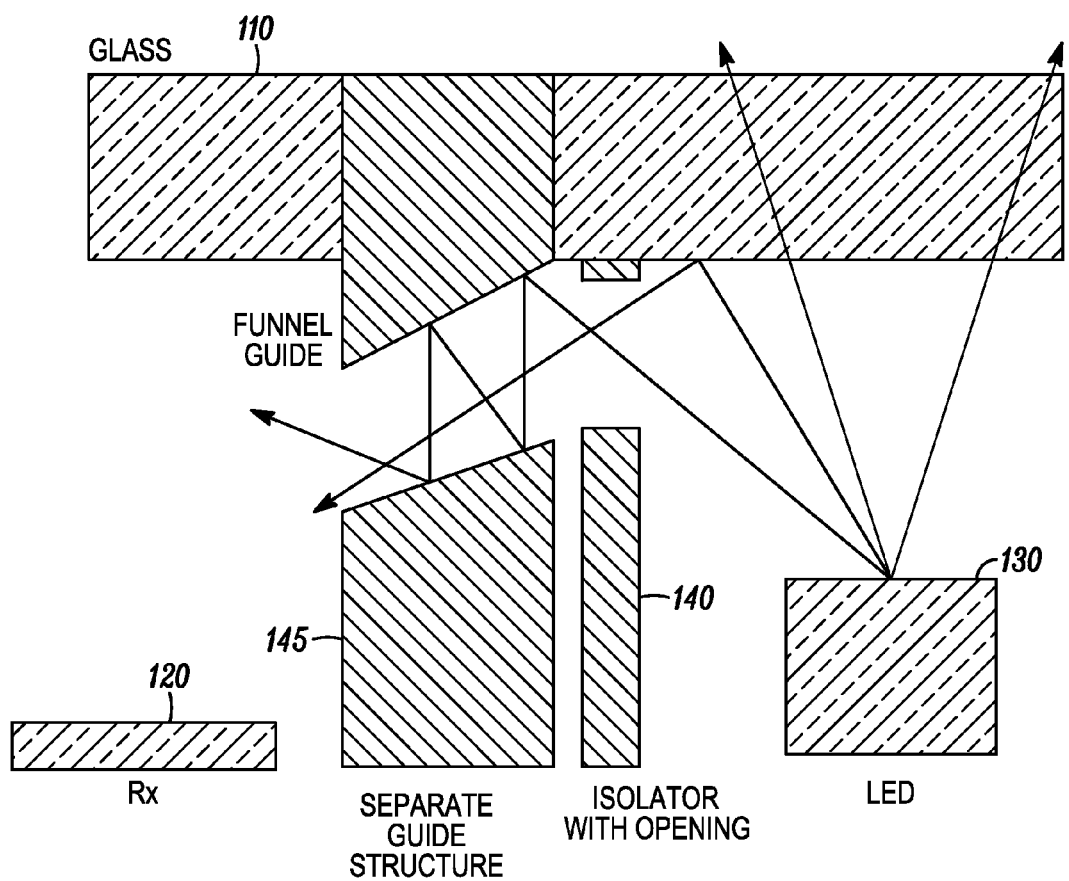
FIG. 8 is an example of an optical guide in a separate structure and apart from an isolator.

Referring to FIG. 8, the optical guide 150 may not necessarily be embedded in isolator wall or isolator barrier 140, because of the likely thinness of isolator wall 140. Instead, isolator wall 140 may include an aperture or opening and be abutted adjacent to a separate structure 145 that includes optical guide 150. Reflected light that passes through the opening in isolator wall 140 continues to travel into optical guide 150 embedded in structure 145. The light rays that enter optical guide 150 bounce off the interior walls of optical guide 150 and exit towards receiver 120.

Figure 9:
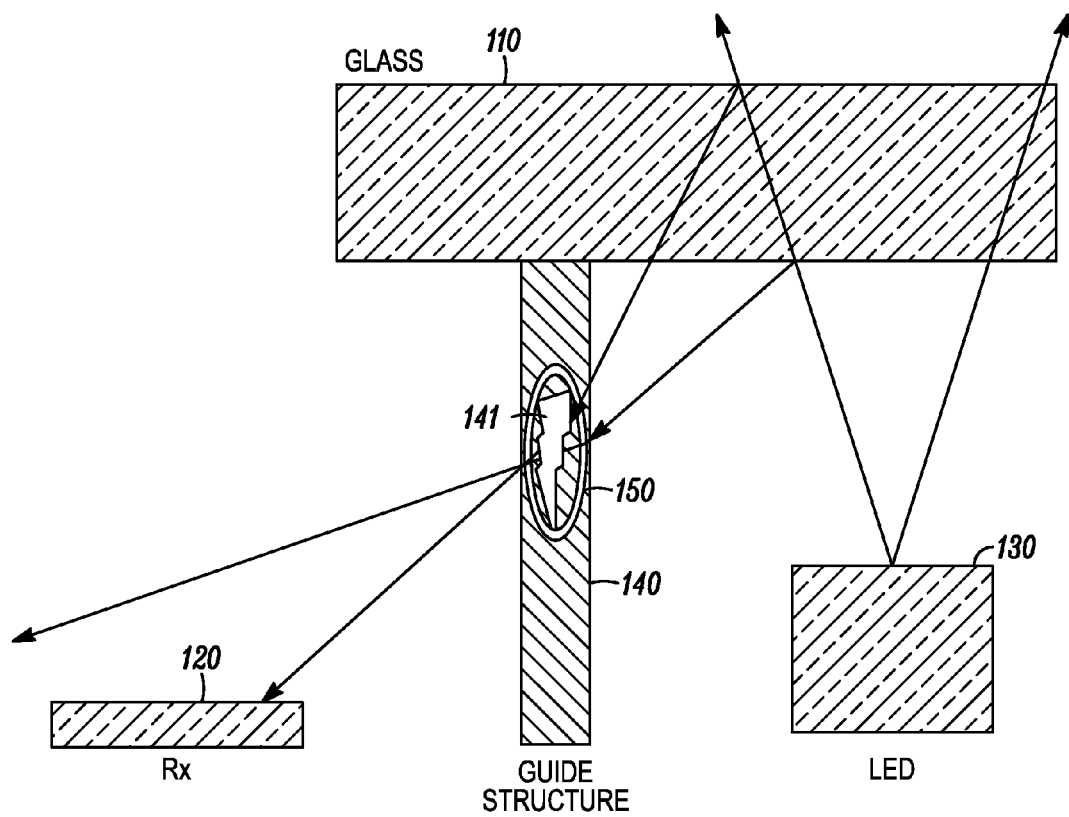
FIG. 9 shows an optical guide with a lensing structure.

In another embodiment, shown in FIG. 9, an optical guide 150 may include a lensing structure 147 that directs or diverges light toward or away from the receiver 120 based on incoming light ray direction and/or an originating position (hence, a directional filtering lensing scheme is described that will cover rejecting or passing light rays with certain angles; in addition, a filter that passes certain wavelengths is contemplated as well for lensing structure 147) to minimize local coupling while resolving blind spots associated with a proximity sensor. Therefore, reflected light rays from an object 200 are enhanced for greater reception at receiver 120. The optical filtering in lensing structure 147 is to differentiate between undesirable internally reflected light and desirable reflected light wavelengths or optical spectrums. That optical filtering material can be designed in conjunction with the optical guide filtering characteristics. In the same vein, the glass interface can include different optical filtering characteristics in one portion of the glass interface than a second portion of the glass interface. Specifically, the glass interface covering the transmitting section can include optical filtering characteristics different than the portion of the glass interface covering the receiving section. The glass interface materials can also have a shutter feature embedded in it that passes or blocks optical signals from reaching the receiver at specific times. The optical guide itself can include the same shutter feature. Shutter feature can be thought of as controlling transparency with an electrical control signal. In other words, by applying an electrical signal an object can be transparent at one time and opaque at another time upon application of a different electrical signal.

Figure 10:
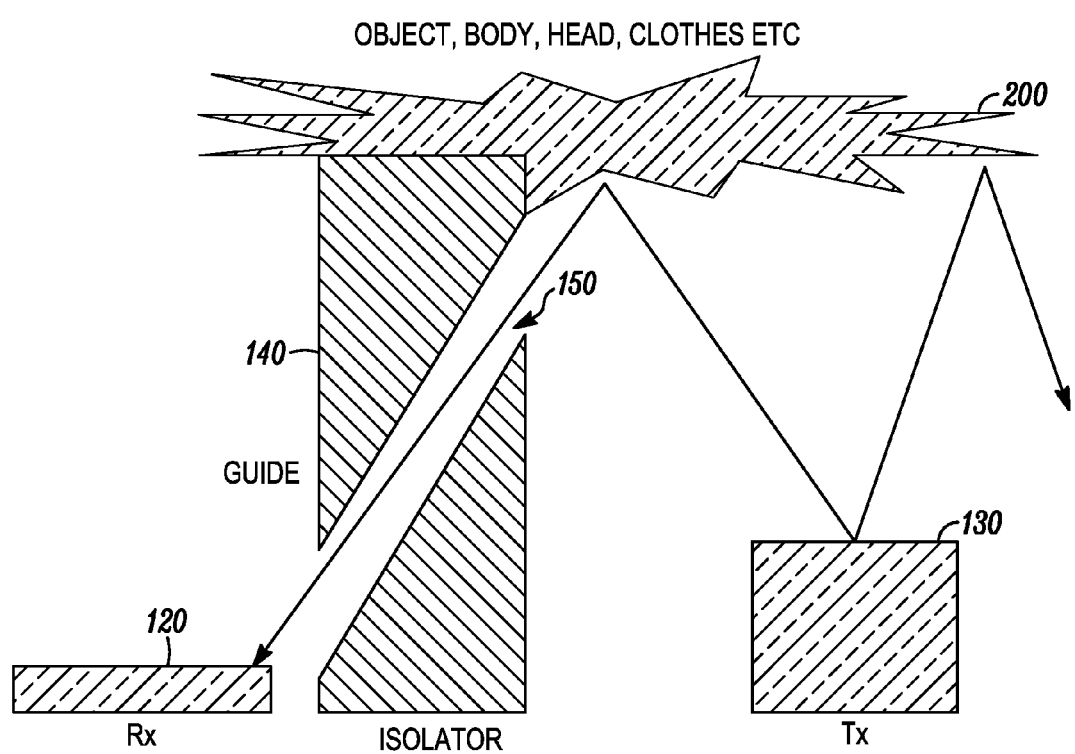
FIG. 10 shows an example of an optical guide in cooperation with an air interface instead of a glass interface.

Referring to FIG. 10, isolator barrier 140 once again has an embedded straight optical guide 150, sometimes referred to as straight pipe coupling. However, the glass interface 110 is either completely removed or contains an aperture or opening that enables an air interface to form between an object 200 and the transmitter 130. As shown in FIG. 10, emitted light from transmitter 130 reflects off of a near object 200 and travels within optical guide 150 to be received by receiver 120. A glass interface 110 may have openings in it above transmitter 130 or receiver 120 or over both transmitter 130 and receiver 120. In addition to air and glass interfaces, the interfaces can be comprised of plastic and semi-permeable material.

Figure 11A:
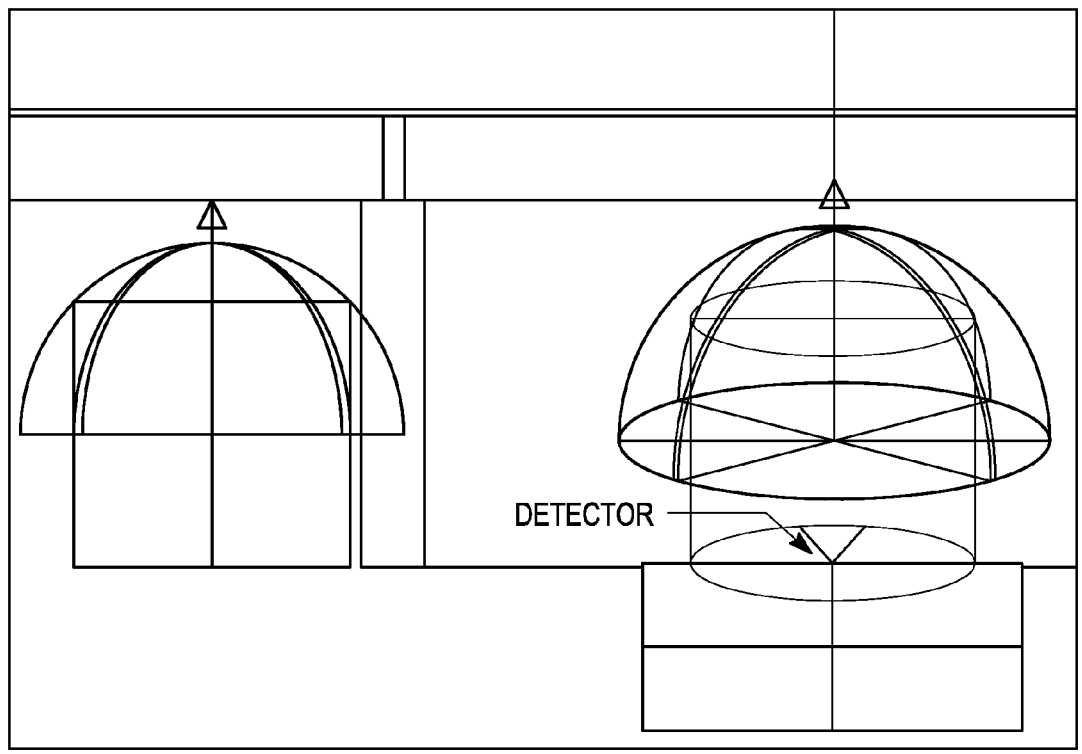
FIG. 11A and FIG. 11B show a simulation model and results respectively of a blind spot.

Referring to FIG. 11A, a simulated model is shown that depicts the isolator barrier as embedded within a glass interface. The isolator barrier extends through the glass thickness for best elimination of local coupling. The glass interface can be thick, hence making local coupling high. Extending the isolator barrier through the glass eliminates local coupling. Otherwise, the isolator barrier can stop at the underside or internal side of the glass barrier, if the glass is too thin. In doing so, unwanted local coupling is substantially eliminated by the thinness of the glass and by the presence of the isolator barrier.

Figure 11B:
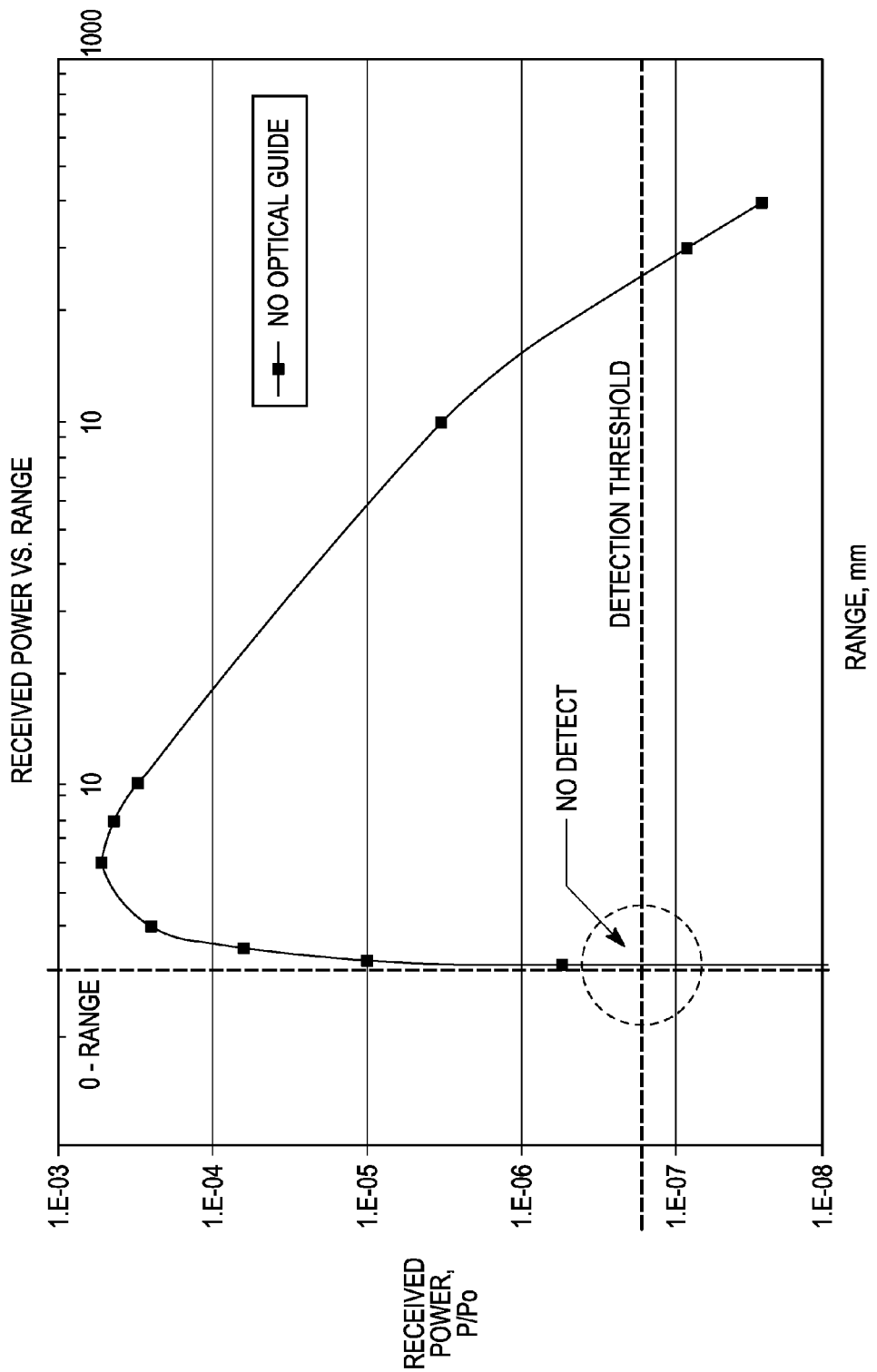

Referring to FIG. 11B, the figure shows a blind spot scenario where an object that is in very close proximity to the glass interface is not detectable and the received signal falls below detection threshold in a sharp dropoff. As the object distance increases, the proximity sensor is able to detect the presence of the object (normal operation range). When the object distance increases beyond range the proximity sensor is unable to detect the presence of the object (Object out of range).

Figure 12A:
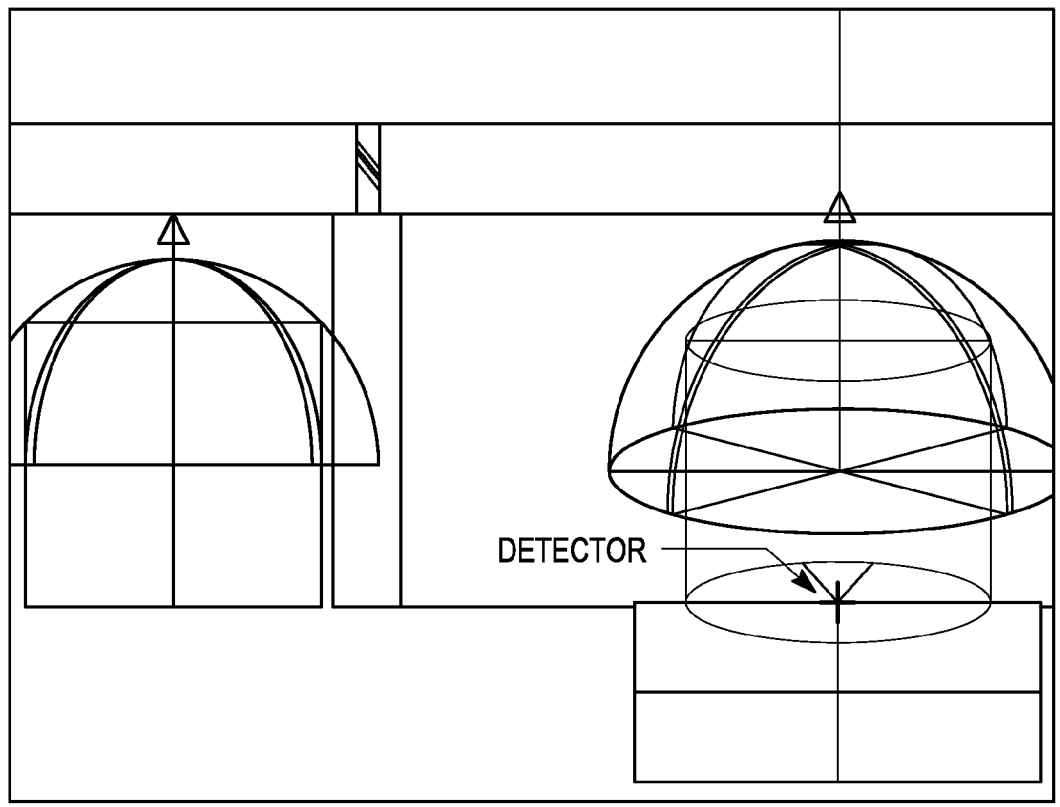
FIG. 12A and FIG. 12B show a simulation model and results when an optical guide is employed.

Referring to FIG. 12A, a simulated model is shown depicting an isolator barrier within the glass interface. However, this isolator barrier has an optical guide included. Specifically, the optical guide is embedded within the isolator barrier.

Figure 12B:
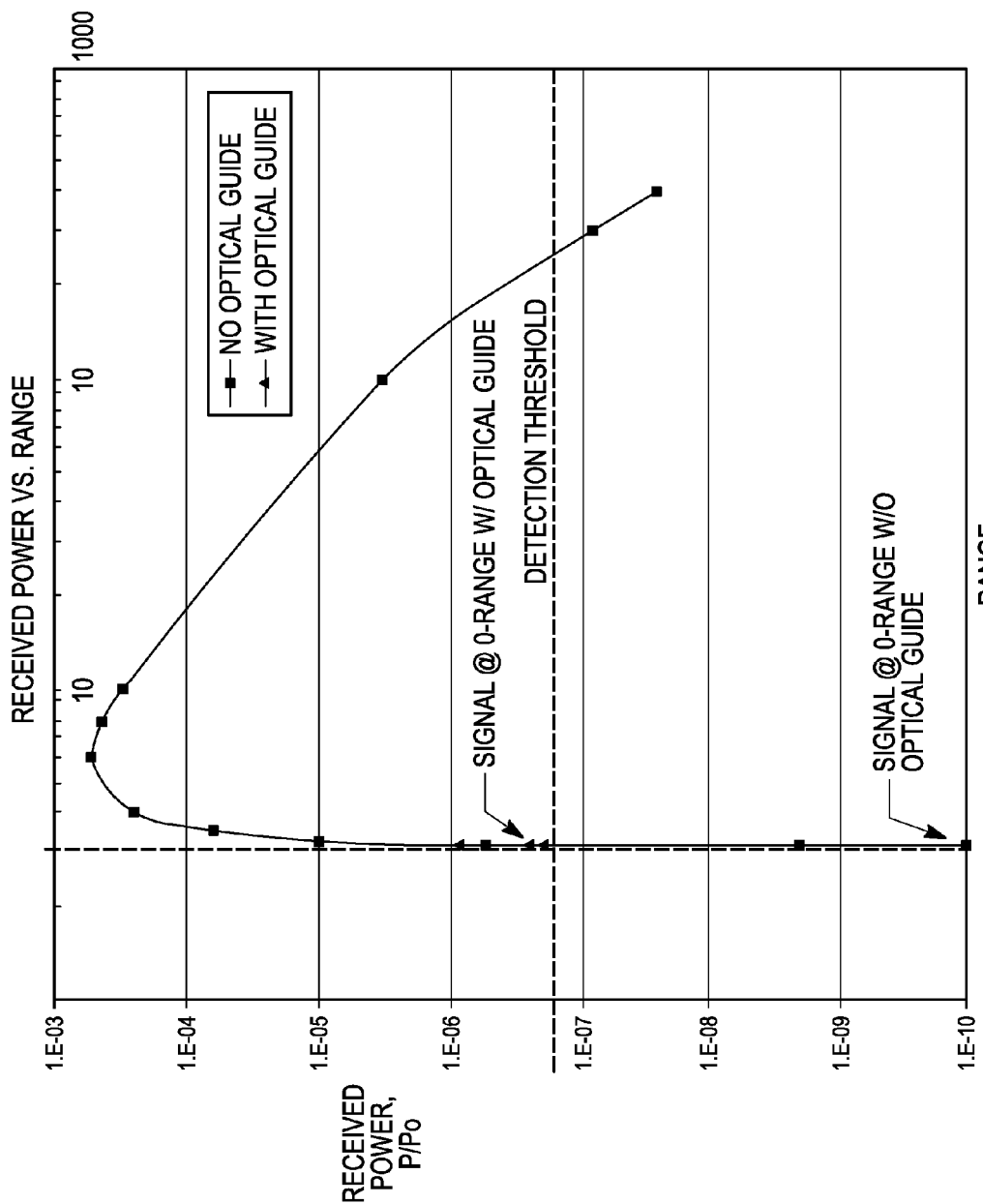

Referring to FIG. 12B, the figure shows a resolution to the blind spot scenario where an object that is in very close proximity to the glass interface is detectable and the received signal falls above the detection threshold. As the object distance increases, the proximity sensor continues to detect the presence of the object (normal operation range). When the object distance increases beyond range the proximity sensor is unable to detect the presence of the object (Object out of range).

Figure 13:
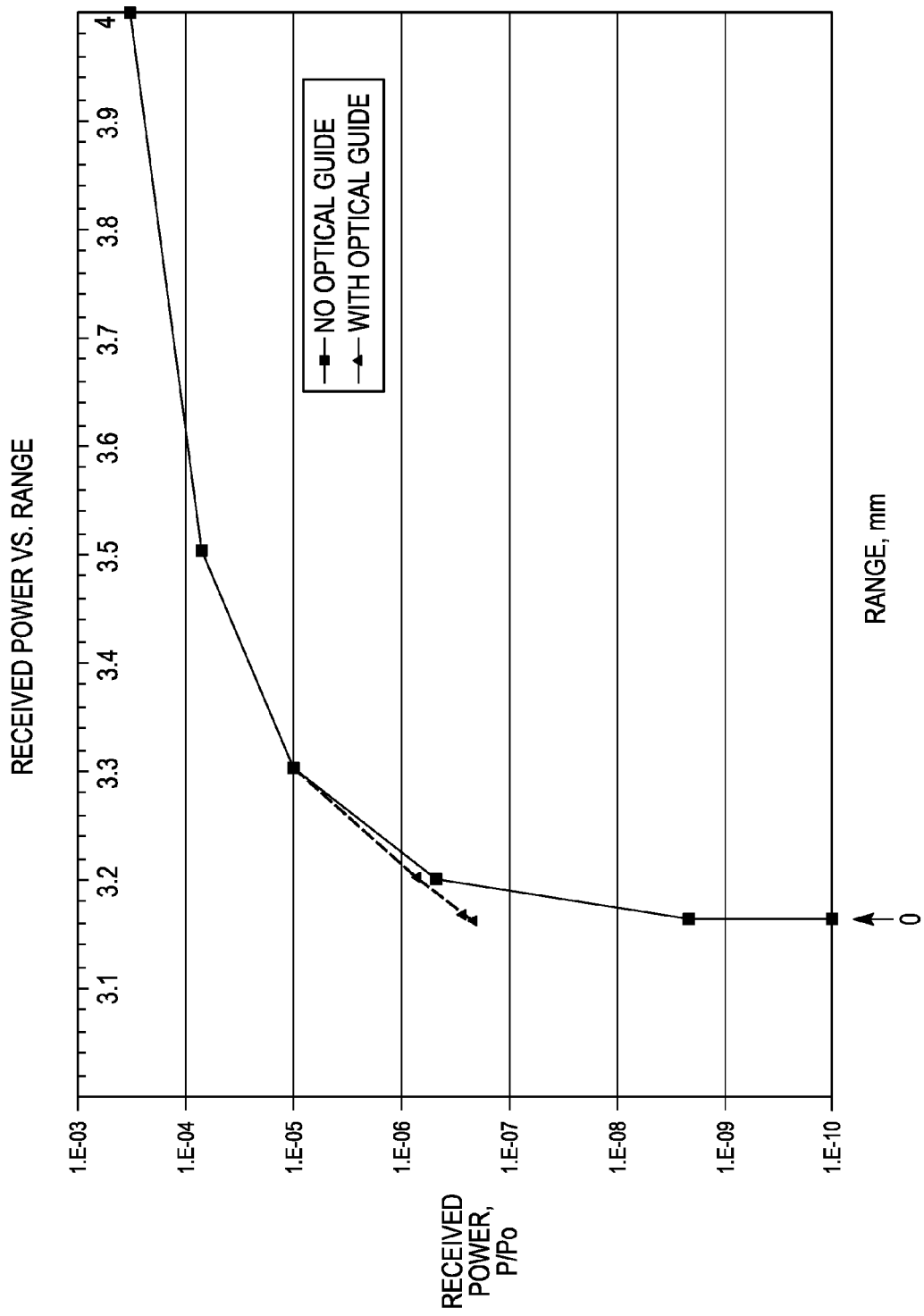
FIG. 13 shows a close-up of the results in FIG. 12 B.

A close up of the detected signal is shown in FIG. 13. Clearly, there is no sharp dropoff of signal when an optical guide is used in cooperation with the isolator barrier. Where the solid line in FIG. 13 corresponds to a structure without an optical guide depicting a sharp dropoff below the detection threshold, while the dashed line corresponds to the structure with an optical guide showing a received signal above the detection threshold when the object is at zero distance or in contact with the glass interface.

Figure 14:
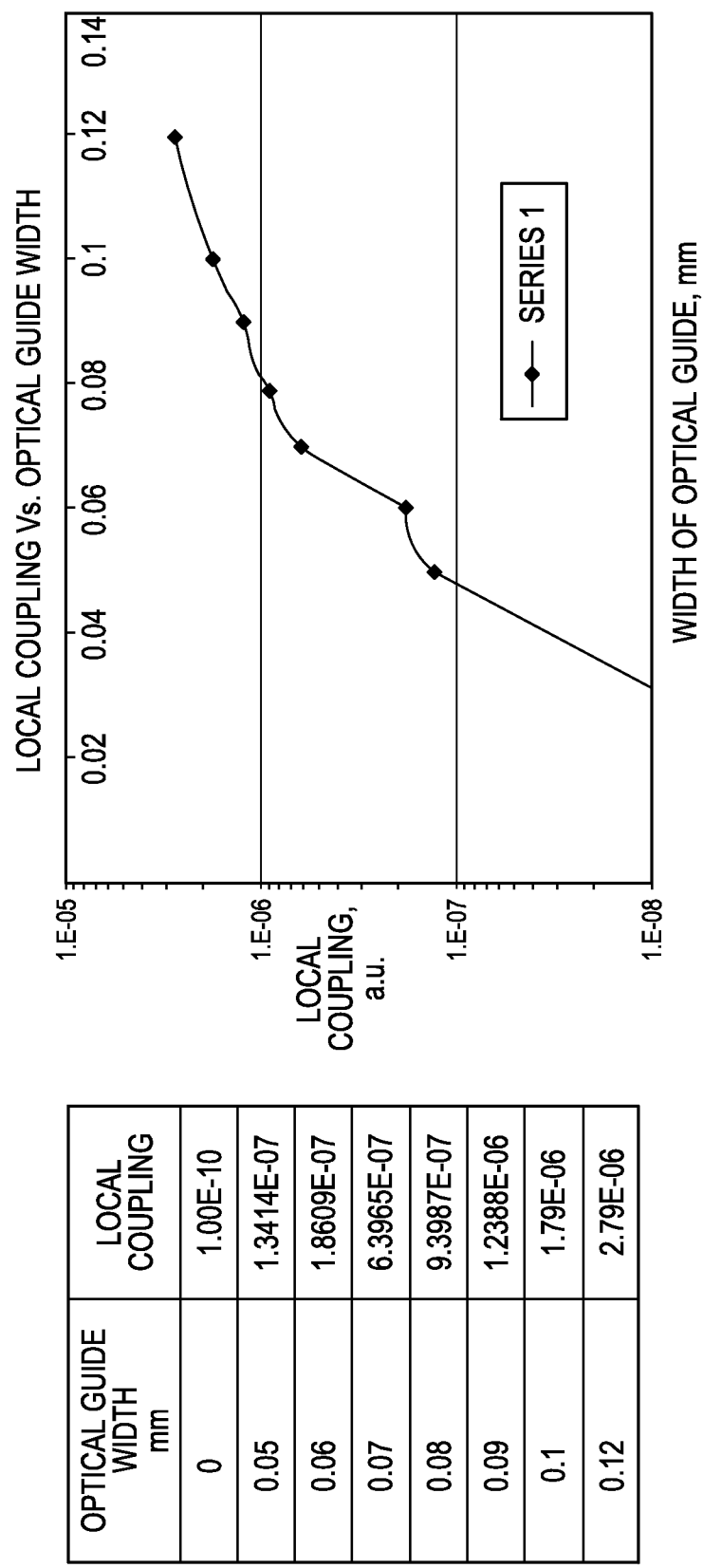
FIG. 14 shows the impact of the optical guide's width upon local coupling.

Referring to FIG. 14, unwanted local coupling is substantially reduced by controlling the width of the optical guide. In addition, other parameters, such as location, shape, refractive index of optical guide material, and tilt angle of the optical guide can also be controlled to manage any local coupling while keeping the reflected signal by the object above the proximity sensor's detection threshold. Local coupling can sometimes be referred to as crosstalk.

Figure 15:
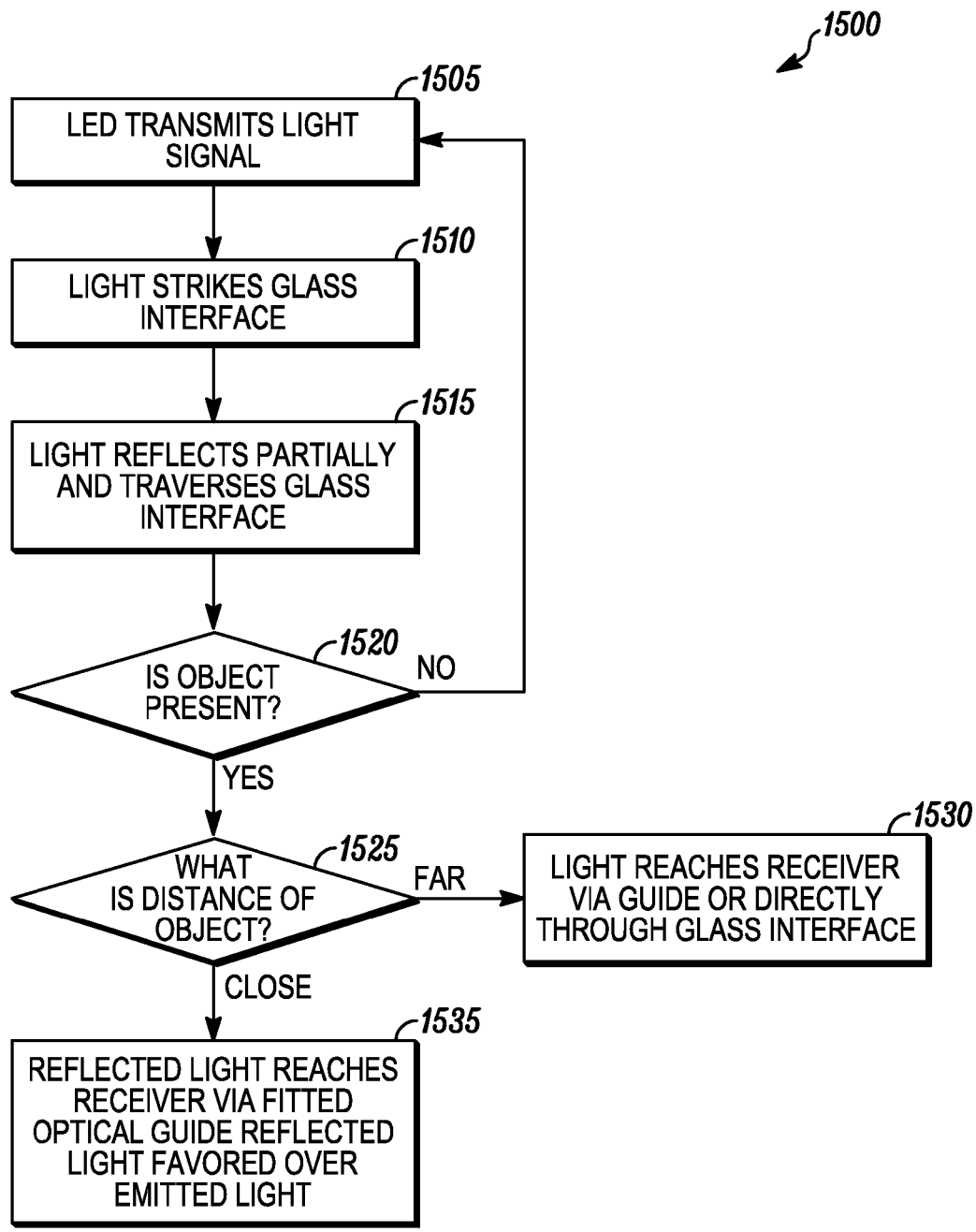
FIG. 15 shows an exemplary flowchart for operation of an optical apparatus having an optical guide.

Referring to FIG. 15, a flowchart 1500 illustrates light propagation between a transmitting section and a receiving section. Step 1505 a light source, for example, an LED transmits an optical signal. The optical signal in the form of light strikes the glass interface in step 1510 and partially reflects internally, but the light largely transverses the glass interface in step 1515. Step 1520 determines if there is an object present. If there is no object present, the partially reflected signal is below the detection threshold and the system keeps transmitting optical signals to keep looking for an object (The optical signal is preferably a pulsed signal). If there is the presence of an object that is in proximity of the glass, but not necessarily touching, covering, or blocking glass surface, in step 1525 the reflected light off the object travels to the receiver of the proximity sensor using at least two main paths in step 1530, including the path through the optical guide and a second path directly to the receiver through the glass interface (i.e., the object covers both the transmitter area and receiver area above the glass interface).

When there is an object in near proximity to the glass interface or actually touching, blocking, or covering the glass interface, step 1535 directs a substantial portion of the reflected light off of the object towards the receiver via a tilted optical guide (tilted in such a direction to favor rays traveling in the general direction of reflected light, and disfavor rays traveling in the general direction of emitted light).

Figure 16:
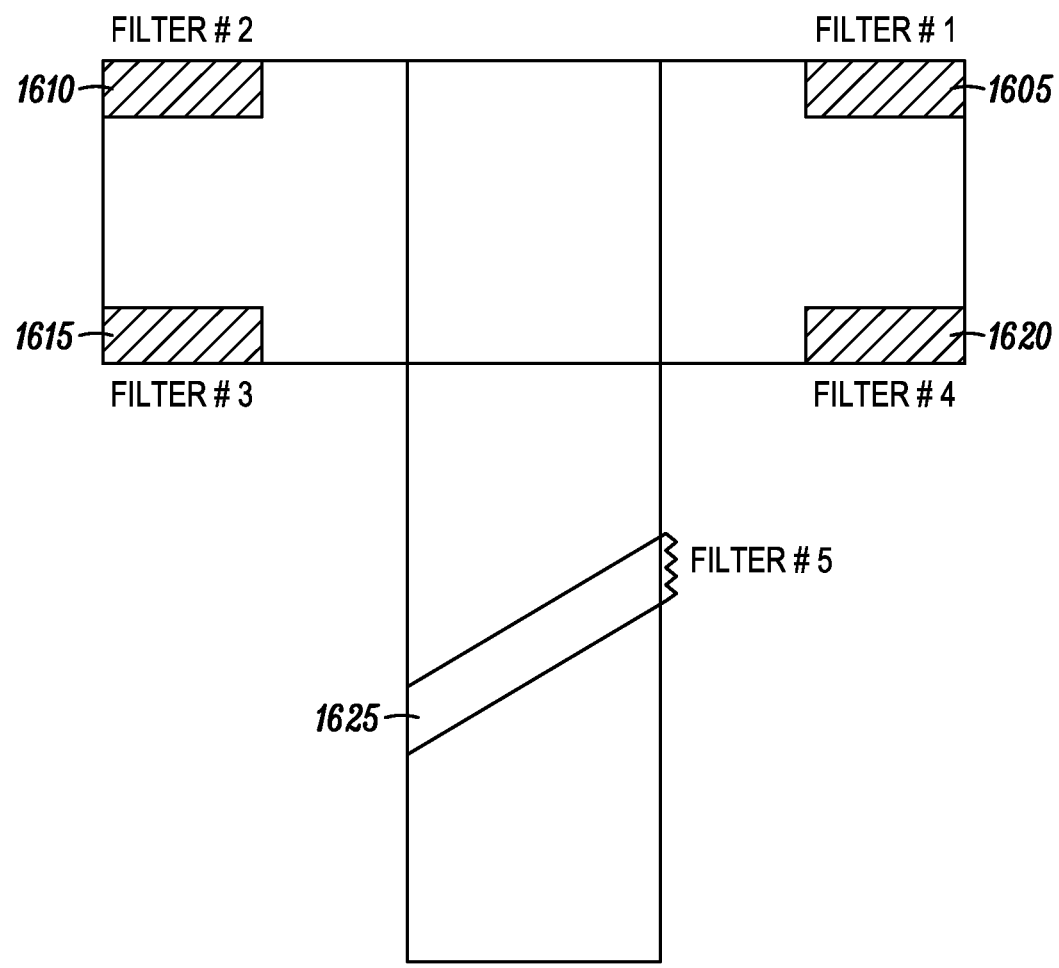
FIG. 16 shows an exemplary configuration of a glass interface and an isolator barrier incorporating one or more filters.

Referring to FIG. 16, several areas are shown that include independent filters or shutter features (1605, 1610, 1615, 1620, and 1625) in either the glass interface or the optical guide. Each filter or shutter feature could cover a fraction of the area shown, rather than the entire portion over the transmitting or receiving section.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

We claim:

1. A method for resolving blind spots associated with a proximity sensor encapsulated in glass, comprising:
   providing an optical guide in cooperation with an isolator wall that separates a transmitting section and a receiving section of the proximity sensor thus resolving one or more blind spots associated with the proximity sensor, further comprising a guide angle of the optical guide that directs light from a glass surface of the encapsulating glass towards a receiver causing more light rays reflected off an external object than light rays transmitted from a light source in the transmitting section; and
   managing acceptable crosstalk subject to the guide angle of the optical guide and the width of the optical guide, while keeping a reflected light signal from the external object above the proximity sensor's detection threshold.

2. The method claimed in claim 1, wherein the optical guide is embedded in the isolator wall.

3. The method claimed in claim 1, wherein the optical guide is abutted against the isolator wall.

4. The method claimed in claim 1, wherein the light source in the transmitting section is an LED.

5. The method claimed in claim 1, wherein the reflected light rays are greater in amplitude at the receiver than the light rays transmitted from the light source in the transmitting section.

6. A method for managing light in a touchscreen device, comprising the steps of:
   providing a first optical path through an interface for reflected light that bounces from an external object after being transmitted from a source on a transmit side of the touchscreen device;
   providing a secondary optical path when the external object is in close proximity to the interface wherein the second optical path comprises an optical guide which is in cooperation with an isolator wall that separates the transmit side and a receive side of the proximity sensor thus resolving one or more blind spots associated with the proximity sensor;
   coupling an optical signal from the transmit side towards the receive side of the touchscreen device when the external object is in close proximity to a proximity sensor, wherein the secondary optical path is oriented in such a manner which opposes coupling light emanating directly from the source on the transmit side and favors coupling light reflected by the external object in close proximity to the proximity sensor; and
   managing acceptable crosstalk subject to a guide angle of the optical signal, while keeping a reflected light signal from the external object above a detection threshold of the proximity sensor.

7. The method claimed in claim 6, wherein the interface is selected from the group consisting of air, glass, plastic, and semi-permeable material.

8. A method for resolving blind spots associated with a proximity sensor in a touchscreen device, comprising the steps of:
   emitting internal light from an LED; and
   detecting light reflecting from an external object in close proximity to a proximity sensor for the touchscreen comprising a glass interface, wherein the external object corresponds to a user of the touchscreen device and further wherein said glass interface comprising an optical guide which is in cooperation with an isolator wall that separates the LED and a receiver of the proximity sensor thus resolving one or more blind spots associated with the proximity sensor;

directing external light reflected off the user toward the receiver of the proximity sensor via a guide angle of the optical guide, wherein the reflected light is in greater proportion than the internal light emitted from the LED; and the reflected light traverses through the glass interface, said glass interface further comprising an optical guide;

managing acceptable crosstalk subject to a guide angle of the optical guide and a width of the optical guide, while keeping a reflected light signal from the external object above a detection threshold of the proximity sensor.

9. The method claimed in claim 8, wherein the reflected light is either infrared light or visible light.

10. The method claimed in claim 8, further comprising the step of:

controlling intensity of the reflected light reaching the receiver via the optical guide by defining a formfactor for the optical guide.

11. The method claimed in claim 10, wherein the form factor of the optical guide includes area of the guide, internal reflectivity of the guide, location, and orientation of the optical guide.

12. An apparatus for directionally filtering light, comprising:
  a. an interface;
  b. a transmit section, below the interface, for transmitting light emitted from an internal light source
  c. a receiver section, below the interface, for receiving light from at least the internal light source;
  d. an isolator barrier, below the interface and between the transmit section and receiver section; and
  e. wherein the isolator barrier comprises a directional light pipe having a pipe coupling that is angled towards the receiver section and whose direction is opposed to the emitted light from the internal light source such that a conducting light is passed preferentially, within the pipe coupling, over the emitted light; wherein the conducting light is light reflected off of an opaque object in close proximity to the interface; wherein the apparatus manages acceptable crosstalk subject to the guide angle of the pipe coupling and the width of the pipe coupling, while keeping a reflected light signal from the external object above a detection threshold of a proximity sensor.

13. The apparatus claimed in claim 12, wherein the pipe coupling is selected from the group consisting of a straight pipe coupling, a curved pipe coupling, and a funnel pipe coupling.

14. The apparatus claimed in claim 12, wherein the light source is an LED.

15. The apparatus claimed in claim 12, wherein the interface is selected from the group consisting of air, glass, plastic, and semi-permeable material.

16. The apparatus claimed in claim 12, further comprising the directional light pipe embedded within the isolator barrier.

17. The apparatus claimed in claim 12, further comprising the directional light pipe abutted against the isolator barrier.

* * * * *